US012756070B2

(12) United States Patent
Li et al.

(10) Patent No.: US 12,756,070 B2
(45) Date of Patent: Oct. 6, 2026

(54) SYSTEM AND METHOD FOR A SELF-PROTECTING SEPARATOR FOR A BATTERY

(71) Applicant: GM GLOBAL TECHNOLOGY OPERATIONS LLC, Detroit, MI (US)

(72) Inventors: Zhe Li, Rochester, MI (US); Xingcheng Xiao, Troy, MI (US); Jing Gao, Rochester, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 773 days.

(21) Appl. No.: 18/098,392

(22) Filed: Jan. 18, 2023

(65) Prior Publication Data

US 2024/0243436 A1 Jul. 18, 2024

(51) Int. Cl.
*H01M 50/457* (2021.01)
*H01M 10/0562* (2010.01)
(Continued)

(52) U.S. Cl.
CPC ..... *H01M 50/457* (2021.01); *H01M 10/0562* (2013.01); *H01M 10/0585* (2013.01); *H01M 10/4235* (2013.01); *H01M 50/403* (2021.01); *H01M 50/426* (2021.01); *H01M 50/431* (2021.01); *H01M 50/446* (2021.01);
(Continued)

(58) Field of Classification Search
CPC ........... H01M 50/457; H01M 10/0562; H01M 10/0585; H01M 10/4235; H01M 50/403; H01M 50/426; H01M 50/431; H01M 50/446; H01M 50/451; H01M 50/491; H01M 2220/20; H01M 2300/0068; H01M 10/052; H01M 10/02; H01M 10/04; H10N 30/206; H10N 30/852; Y02E 60/10
See application file for complete search history.

(56) References Cited

U.S. PATENT DOCUMENTS

| | | | | |
|---|---|---|---|---|
| 10,476,114 B2* | 11/2019 | Cui | ..................... | H01M 10/486 |
| 2008/0292968 A1* | 11/2008 | Lee | ..................... | H01M 10/052<br>429/247 |

(Continued)

FOREIGN PATENT DOCUMENTS

| | | | | |
|---|---|---|---|---|
| CA | 3147031 A1 * | 1/2021 | ............. | H10N 30/00 |
| CN | 104211114 A * | 12/2014 | | |
| KR | 20210099755 A * | 8/2021 | ............ | H01M 4/669 |

OTHER PUBLICATIONS

Jin et al, "Deposition of c-axis orientation aluminum nitride films on flexible polymer substrates by reactive direct-current (DC) magnetron sputtering" Thin Solid Films 520 (2012) 4863-4870. (Year: 2012).*

Translation of KR-20210099755-A (Year: 2021).*

Kabakov et al, "Solid-state crystal growth of lead-free ferroelectrics," J Mater. Chem. C, 2020, 8, 7606. (Year: 2020).*

(Continued)

*Primary Examiner* — Jeffrey T Barton
(74) *Attorney, Agent, or Firm* — Quinn IP Law

(57) ABSTRACT

A self-protecting functional separator for a battery cell is provided. The self-protecting functional separator includes a polymer substrate including a first primary surface and a second primary surface. The self-protecting functional separator further includes a functional layer applied to the first primary surface. The functional layer including a mixture includes a first piezoelectric material including a single crystal-type material and a second piezoelectric material.

18 Claims, 5 Drawing Sheets

(51) Int. Cl.

| | |
|---|---|
| ***H01M 10/0585*** | (2010.01) |
| ***H01M 10/42*** | (2006.01) |
| ***H01M 50/403*** | (2021.01) |
| ***H01M 50/426*** | (2021.01) |
| ***H01M 50/431*** | (2021.01) |
| ***H01M 50/446*** | (2021.01) |
| ***H01M 50/451*** | (2021.01) |
| ***H01M 50/491*** | (2021.01) |
| ***H10N 30/20*** | (2023.01) |
| ***H10N 30/85*** | (2023.01) |

(52) U.S. Cl.
CPC ....... *H01M 50/451* (2021.01); *H01M 50/491* (2021.01); *H10N 30/206* (2023.02); *H10N 30/852* (2023.02); *H01M 2220/20* (2013.01); *H01M 2300/0068* (2013.01)

(56) References Cited

U.S. PATENT DOCUMENTS

| | | | | |
|---|---|---|---|---|
| 2015/0056484 | A1* | 2/2015 | Allen .................... | H01M 10/48 324/426 |
| 2019/0165429 | A1* | 5/2019 | Lu ......................... | H01M 4/134 |
| 2021/0305626 | A1* | 9/2021 | Nakajima ............. | H01M 4/525 |

OTHER PUBLICATIONS

Bottino et al, "Solubility Parameters of Poly(vinylidene fluoride)," 1988. (Year: 1988).*
Translation of CN104211114A (Year: 2014).*
Shinkosha "YSZ: Yttria-stabilized Zirconia," 2026, evidentiary reference (Year: 2026).*
Zhang et al "Studying the Pyroelectric Effects of LiNbO3 Modified Composites," Nanoscale Research Letters, 2020, 15:106, evidentiary reference (Year: 2020).*

* cited by examiner

SYSTEM AND METHOD FOR A SELF-PROTECTING SEPARATOR FOR A BATTERY

INTRODUCTION

The present disclosure relates to a system and method for a self-protecting separator for a battery.

Lithium-ion batteries and lithium metal batteries are desirable candidates for powering electronic devices in the consumer, automotive, and aerospace industries due to their relatively high energy density, high power density, lack of memory effect, and long cycle life, as compared to other rechargeable battery technologies, including lead-acid batteries, nickel-cadmium and nickel-metal-hydride batteries. The widespread commercialization of lithium batteries, however, is dependent upon their ensured performance under normal operating conditions, in the event of manufacturing defects, upon aging, as well as under a variety of abuse conditions, including exposure to high temperatures, overcharge, over-discharge, and exposure to external forces that physically damage one or more internal components thereof. Conditions that affect the thermal, chemical, electrical, and/or physical stability of lithium batteries may increase the internal temperature of such batteries, which may, in turn, set-off additional undesirable events and/or chemical reactions within the batteries that may lead to additional heat generation.

SUMMARY

A self-protecting functional separator for a battery cell is provided. The self-protecting functional separator includes a polymer substrate. The polymer substrate includes a first primary surface and a second primary surface. The self-protecting functional separator further includes a functional layer applied to the first primary surface, the functional layer including a mixture including a first piezoelectric material including a single crystal-type material and a second piezoelectric material.

In some embodiments, the functional layer is a first functional layer. The self-protecting functional separator further includes a second functional layer including a mixture of the first piezoelectric material and the second piezoelectric material applied to the second primary surface.

In some embodiments, the first piezoelectric material includes lithium niobate ($LiNbO_3$), lithium tantalate ($LiTaO_3$), $Pb(Zr_{0.52}Ti_{0.48})O_3$ (PZT), yttria-stabilized zirconia (YSZ), aluminum nitride (AlN), zinc oxide (ZnO), or gallium nitride (GaN).

In some embodiments, the second piezoelectric material includes polyvinylidene fluoride (PVDF) or poly (vinylidene difluoride-trifluoro ethylene) (P(VDF-TrFE).

In some embodiments, the first piezoelectric material is present in a range from 1 part per 100 parts by total weight of the functional layer to 25 parts per 100 parts by total weight of the functional layer.

In some embodiments, the functional layer includes a porosity density of at least 30%.

In some embodiments, a thickness of the functional layer is in a range from 500 nanometers to 20 micrometers.

In some embodiments, a thickness of the self-protecting functional separator is in a range from 5 micrometers to 100 micrometers.

In some embodiments, the self-protecting functional separator is configured as a passive mechanism, with a voltage potential of the battery cell selectively causing the functional layer to contract.

In some embodiments, the self-protecting functional separator further includes a plurality of electrodes disposed to provide an input voltage to the self-protecting functional separator. The self-protecting functional separator is configured as an active mechanism, with the input voltage selectively causing the functional layer to contract.

According to one alternative embodiments, a battery cell including a self-protecting functional separator is provided. The battery cell includes an anode, a cathode, an electrolyte, and the self-protecting functional separator. The self-protecting functional separator includes a polymer substrate including a first primary surface and a second primary surface. The self-protecting functional separator further includes a functional layer applied to the first primary surface. The functional layer includes a mixture including a first piezoelectric material including a single crystal-type material and a second piezoelectric material.

In some embodiments, the functional layer is a first functional layer. The self-protecting functional separator further includes a second functional layer including a mixture of the first piezoelectric material and the second piezoelectric material applied to the second primary surface.

In some embodiments, the first piezoelectric material includes lithium niobate ($LiNbO_3$), lithium tantalate ($LiTaO_3$), $Pb(Zr_{0.52}Ti_{0.48})O_3$ (PZT), yttria-stabilized zirconia (YSZ), aluminum nitride (AlN), zinc oxide (ZnO), or gallium nitride (GaN).

In some embodiments, the second piezoelectric material includes polyvinylidene fluoride (PVDF) or poly (vinylidene difluoride-trifluoro ethylene) (P(VDF-TrFE).

In some embodiments, the electrolyte includes a solid-state electrolyte including the first piezoelectric material.

In some embodiments, the electrolyte includes a gel electrolyte including the first piezoelectric material.

In some embodiments, the electrolyte includes a quasi-solid-state electrolyte including the first piezoelectric material.

According to one alternative embodiment, a method to create a self-protecting functional separator for a battery cell is provided. The method includes applying a functional layer including a mixture of a first piezoelectric material including a single crystal-type material and a second piezoelectric material to a polymer substrate. The method further includes drying the functional layer upon the polymer substrate.

In some embodiments, the first piezoelectric material includes lithium niobate ($LiNbO_3$), lithium tantalate ($LiTaO_3$), $Pb(Zr_{0.52}Ti_{0.48})O_3$ (PZT), yttria-stabilized zirconia (YSZ), aluminum nitride (AlN), zinc oxide (ZnO), or gallium nitride (GaN). The second piezoelectric material includes polyvinylidene fluoride (PVDF) or poly (vinylidene difluoride-trifluoro ethylene) (P(VDF-TrFE).

The above features and advantages and other features and advantages of the present disclosure are readily apparent from the following detailed description of the best modes for carrying out the disclosure when taken in connection with the accompanying drawings.

DETAILED DESCRIPTION

Figure 1:
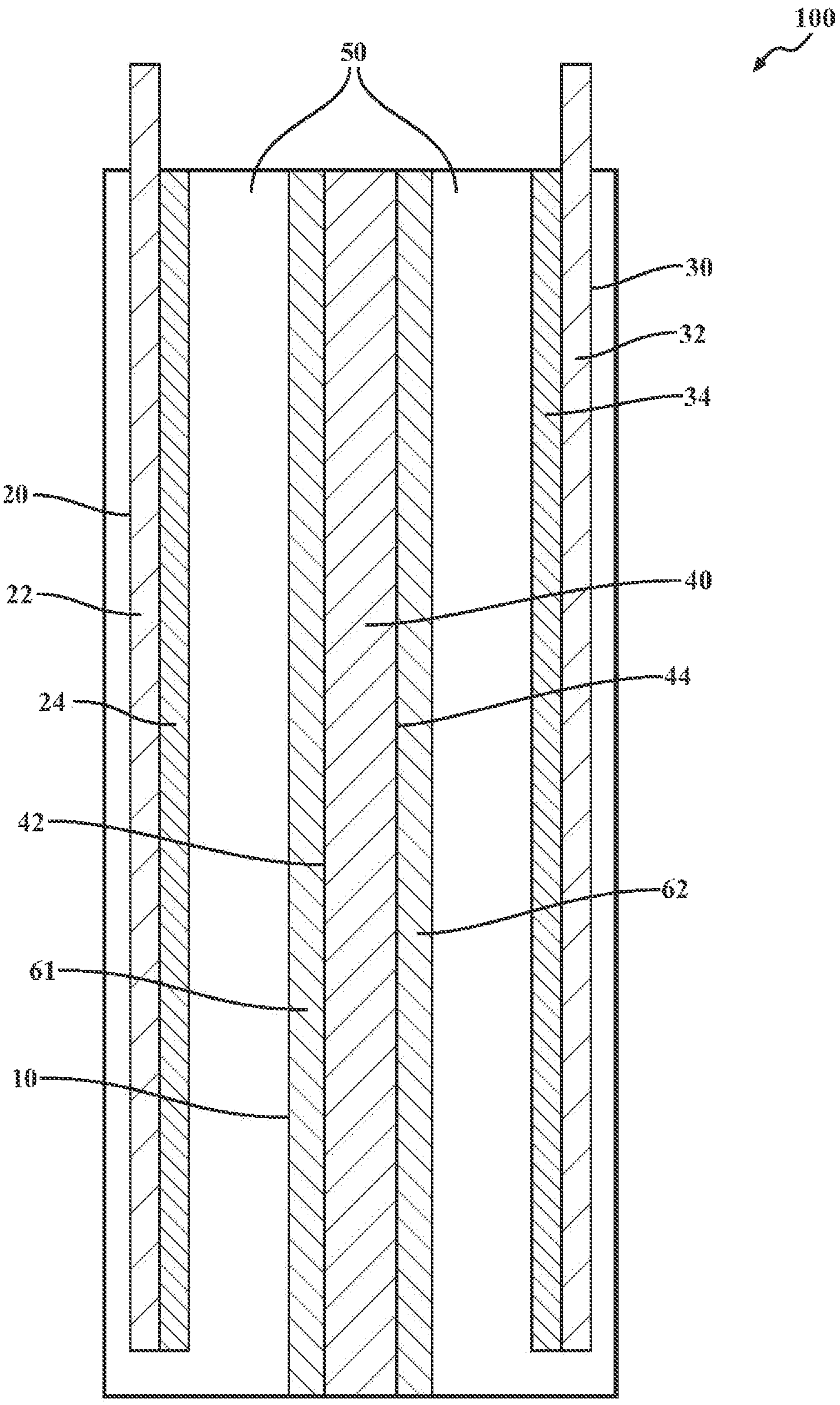
FIG. 1 schematically illustrates in cross-section an exemplary battery cell including functional separator including a polymer substrate including a first functional layer and a second functional layer, in accordance with the present disclosure.

A battery system may include a plurality of battery cells. A battery cell may include an anode electrode, a cathode electrode, a polymer separator, and an electrolyte.

A self-protecting functional separator for a battery is provided. The disclosed system and method may be used for liquid-state battery or solid-state battery. An electrolyte within the battery cell may be a solid electrolyte, a gel electrolyte, a quasi-solid electrolyte, or a liquid electrolyte.

The disclosed functional separator may or may not include a substrate layer, for example, including polymer materials used in the art within a polymer separator of a battery cell. The substrate layer may be planar and include a first primary surface and a second primary surface. The disclosed functional separator includes a functional layer coated on the first primary surface of the substrate layer. The functional layer changes physical dimensions based upon a voltage present or provided to the functional layer. This change in physical dimension may be utilized to configure the functional separator to be self-protecting or to adjust dimensions to avoid damage. The disclosed functional separator may include a second functional layer coated on the second primary surface of the substrate layer. The disclosed functional separator may include two functional layers without a core substrate layer.

The functional layer contains one or more piezoelectric materials. The functional layer may include piezoelectric materials such as single crystal-type materials such as lithium niobate ($LiNbO_3$), lithium tantalate ($LiTaO_3$), $Pb(Zr_{0.52}Ti_{0.48})O_3$ (PZT), yttria-stabilized zirconia (YSZ), aluminum nitride (AlN), zinc oxide (ZnO), gallium nitride (GaN), etc. The single crystal-type material may be present as nanoparticles within the functional layer.

The functional layer may be a composite layer, including nanoparticles of the single crystal-type material piezoelectric material and a second material. Nanoparticles of the single crystal-type material piezoelectric material may be mixed with other piezoelectric materials, such as a polyvinylidene fluoride (PVDF), poly (vinylidene difluoride-trifluoro ethylene) (P(VDF-TrFE), or other similar materials as a composite piezoelectric layer coated on the polymer separator. The nanoparticles blended into the other piezoelectric material such as PVDF enhance the piezoelectric and electric properties of the created layer. The separator coated with a mixture of PVDF and a single crystal-type material may be described as including a composite piezoelectric functional layer. Nanoparticles of the piezoelectric material may be present in the functional layer in a range from 1 part per 100 parts by total weight of the functional layer to 25 parts per 100 parts by total weight of the functional layer. In one embodiment, the second piezoelectric material, for example, including PVDF, may be present in the functional layer in a range from 75 part per 100 parts by total weight of the functional layer to 99 parts per 100 parts by total weight of the functional layer.

The functional separator, including the polymer substrate and the one or more functional layers, may be described as a planar sheet including a first primary surface and a second primary surface. Nanoparticles of the single crystal-type materials may be present in relatively higher concentrations near the first primary surface of the functional separator and the second primary surface of the functional separator, and the nanoparticles of the single crystal-type materials may be present in relatively lower concentrations near a center of the functional separator. In one embodiment, concentration of the single crystal-type materials within the separator may vary according to a gradient, with relatively higher concentrations at the first primary surface of the functional separator and the second primary surface of the functional separator, a relatively lower concentration at the center of the functional separator, and gradually decreasing concentrations of the piezoelectric material between the primary surfaces of the functional separator and the center of the functional separator. In another embodiment, the concentration of the single crystal-type materials within the separator may include relatively higher concentrations at the first primary surface of the functional separator and may include gradually decreasing concentrations of the single crystal-type materials at points further away from the first primary surface of the functional separator.

Porosity density of the functional layer may be controlled to be at least 30%. Thickness of the functional layer may be controlled to be in a range from 500 nanometers to 20 micrometers. Thickness of the functional separator including the functional layer(s) may be controlled to be in a range from 5 micrometers to 100 micrometers.

The battery cell may include a solid-state electrolyte or a gel electrolyte. The solid-state electrolyte or a gel electrolyte may additionally include one or more piezoelectric materials. For solid-state electrolytes or gel electrolytes, the piezoelectric materials may include single crystal-type materials such as $LiNbO_3$ and/or $LiTaO_3$. The piezoelectric materials may be mixed with the conventional solid electrolyte materials.

The functional separator may be designed to react to an internal short circuit of the battery cell through a passive mechanism or an active mechanism. For the passive mechanism design, the functional layer will expand within the operating battery cell voltage window from 0.5 Volts to 5 Volts. The voltage potential between the anode and the cathode causes the functional separator to expand. This will increase the real contact area between the separator and the electrodes. When a short circuit happens, the separator will shrink due to the dramatic voltage decrease and break the local short circuit.

For the active mechanism design, a voltage input may be applied to the functional separator when a cell voltage drop indicating a short circuit is detected. Such an active mechanism design may require a sensor to monitor an open circuit voltage of the battery, electrodes disposed to apply the voltage input to the functional separator, and a control device or processor configured to selectively apply the voltage input to the functional separator when the voltage drop is detected.

In one exemplary process to create the disclosed functional separator, a first pump may be utilized in an electrospraying operation to deposit PVDF upon a grounded substrate. Simultaneously and/or subsequently, nanoparticles of the single crystal-type materials may be deposited upon the grounded substrate, for example, in an electrospinning process.

The functional layer may be single-sided or double-sided. In a process to create the single-sided functional layer, the base material layer (for example, PVDF) may be deposited first. The single crystal-type material may then be deposited as a top function layer.

In a process to create a double-sided functional layer, the process may include first depositing a first portion of the single crystal-type material, then depositing the based material layer, and then depositing a remaining portion of the single crystal-type material.

The disclosed functional separator may increase interface contact area within the battery cell to avoid high interfacial impedance caused by localized plating and stripping in a lithium metal battery cell. The disclosed functional separator may avoid dendrite growth cycle life. The disclosed functional separator may avoid short circuit by self-protection according to one of the passive mechanism and the active mechanism described herein.

Referring now to the drawings, wherein like reference numbers refer to like features throughout the several views, FIG. 1 schematically illustrates in cross-section an exemplary battery cell 100 including functional separator 10 including a polymer substrate 40 including a first functional layer 61 and a second functional layer 62. The battery cell 100 is illustrated including the functional separator 10, an anode 20, a cathode 30, and an electrolyte 50. The anode 20 includes a current collector 22 and an anode electrode 24. The cathode 30 includes a current collector 32 and a cathode electrode 34.

The polymer substrate 40 may be a planar sheet and is illustrated including a first primary surface 42 and a second primary surface 44. The first functional layer 61 is applied to the first primary surface 42. The second functional layer 62 is applied to the second primary surface 44. Each of the functional layers 61, 62 may include a first piezoelectric material including a single crystal-type material. Each of the functional layers 61, 62 may further include a second piezoelectric material including PVDF, P(VDF-TrFE), or another similar piezoelectric material. The single crystal-type material may be present in the functional layers 61, 62. The single crystal-type material may additionally be present in the polymer substrate 40.

The functional separator 10 may be single-sided or double-sided, meaning that either the first functional layer 61 or the second functional layer 62 may be omitted.

The components of the battery cell 100 are illustrated with thicknesses for purposes of describing the various components and layers. Actual dimensions and thicknesses may vary, for example, with the actual thicknesses of the layers of the functional layers 61, 62 being microscopic.

The battery cell 100 is illustrated configured to operate as a passive mechanism. Voltage change or voltage potential change of the battery cell 100 may be in a normal operating range consistent with no short circuit condition existing in the battery cell 100. In battery cell failure conditions, a dendrite may form upon the anode 20 or the cathode 30 and may accumulate to a point where the dendrite creates the short circuit condition in the battery cell 100. The short circuit condition causes the voltage potential of the battery cell 100 to plummet or quickly drop. The functional layers 61, 62 are configured to shrink or contract when the voltage potential of the battery cell 100 drops. This contraction of the functional layers 61, 62 may cause the functional separator 10 to retract and self-protect from the dendrite. This self-protection function of the functional separator 10 may extend the lifespan of the battery cell 100. This self-protection function may be coupled with an alert system, for example, monitoring the voltage drop condition of the battery cell voltage potential, to warn a user to promptly seek maintenance of the battery cell 100.

FIG. 1 illustrates a space between the anode electrode 24 and the functional layer 61 and a space between the cathode electrode 34 and the functional layer 62. These spaces are consistent with the electrolyte 50 being a solid electrolyte. In another embodiment wherein the electrolyte 50 is a liquid, the anode electrode 24 and the functional layer 61 are in contact with each other, and the cathode electrode 34 and the functional layer 62 are in contact with each other.

In FIG. 1, the polymer substrate 40 is illustrated as a distinct structural feature from the functional layer 61, 62. In one embodiment, the polymer substrate 40 may be thin or may be eliminated, with the functional layers 61, 62 assuming the function of the polymer substrate 40.

Figure 2:
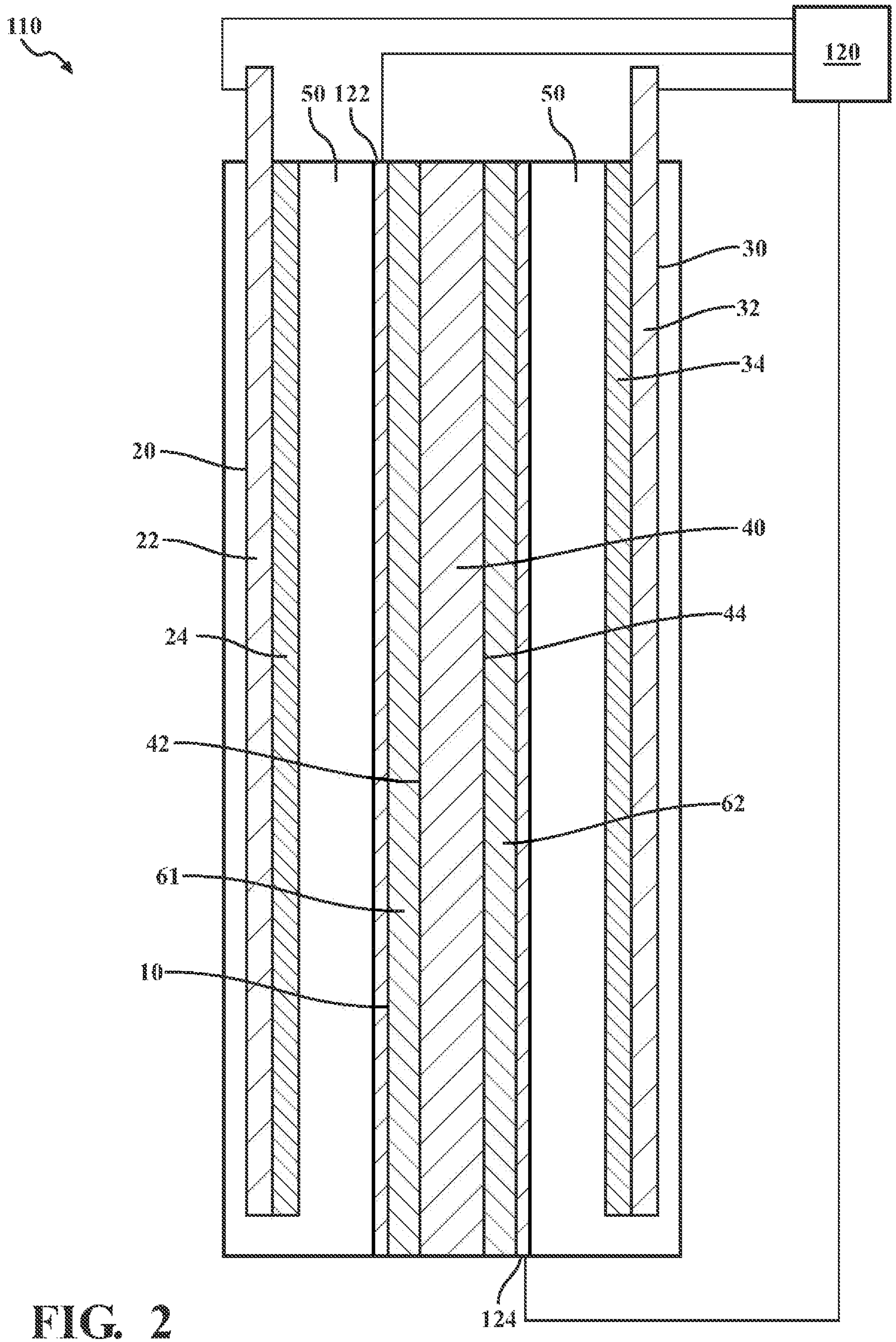
FIG. 2 schematically illustrates in cross-section an alternative exemplary battery cell, wherein the battery cell is configured to operate as an active mechanism, in accordance with the present disclosure.

In embodiments wherein a liquid electrolyte 50 is utilized and the electrodes 24, 34 are in direct contact with the corresponding functional layers 61, 62, the battery cell 100 of FIG. 1 may be configured to operate as an active mechanism by controlling voltage potential between the anode 20 and the cathode 30. The electrical field generated between the anode 20 and the cathode 30 may be utilized to actively control the functional layers 61, 62. FIG. 2 schematically illustrates in cross-section an alternative exemplary battery cell 110, wherein the electrolyte 50 is a solid electrolyte and the battery cell 110 is configured to operate as an active mechanism. The battery cell 110 is similar to the battery cell 100 of FIG. 1, except that electrodes 122 and 124 are disposed to provide an input voltage to the functional separator 10 and activate a contraction response in the functional layers 61, 62 in response to a voltage potential drop in the battery cell 110. The electrodes 122 and 124 are illustrated as thin conductive layers, for example, with thicknesses in a range from 20 nanometers to 100 nanometers.

The battery cell 110 is illustrated including the functional separator 10 including the polymer substrate 40 including the first functional layer 61 and the second functional layer 62. The battery cell 110 is illustrated including the functional separator 10, an anode 20, a cathode 30, and an electrolyte 50. The anode 20 includes a current collector 22 and an anode electrode 24. The cathode 30 includes a current collector 32 and a cathode electrode 34.

The polymer substrate 40 may be a planar sheet and is illustrated including the first primary surface 42 and the second primary surface 44. The first functional layer 61 is applied to the first primary surface 42. The second functional layer 62 is applied to the second primary surface 44. Each of the functional layers 61, 62 may include a first piezoelectric material including a single crystal-type material. Each of the functional layers 61, 62 may further include a second piezoelectric material including PVDF, P(VDF- TrFE), or another similar piezoelectric material. The single crystal-type material may be present in the functional layers 61, 62. The single crystal-type material may additionally be present in the polymer substrate 40.

The functional separator 10 may be single-sided or double-sided, meaning that either the first functional layer 61 or the second functional layer 62 may be omitted.

The battery cell 110 is illustrated configured to operate as an active mechanism. A control device 120 is illustrated configured for monitoring a voltage potential between the current collector 22 and the current collector 32. The control device 120 may be a circuit board, a computerized controller including a processor, or another electronic device capable of monitoring voltage, making a determination, and generating a signal. Voltage potential change of the battery cell 110 may be in a normal operating range consistent with no short circuit condition existing in the battery cell 110. In battery cell failure conditions, a dendrite may form upon the anode 20 or the cathode 30 and may accumulate to a point where the dendrite creates the short circuit condition in the battery cell 110. The short circuit condition causes the voltage potential of the battery cell 110 to plummet or quickly drop. The control device 120 is configured for monitoring the voltage potential of the battery cell 110 and providing an input voltage to the electrodes 122, 124. The functional layers 61, 62 are configured to shrink or contract when the input voltage applied by the electrodes 122, 124 drops. This contraction of the functional layers 61, 62 may cause the functional separator 10 to retract and self-protect from the dendrite. This self-protection function of the functional separator 10 may extend the lifespan of the battery cell 100. This self-protection function may be coupled with an alert system, for example, monitoring the voltage drop condition of the battery cell voltage potential, to warn a user to promptly seek maintenance of the battery cell 100.

Figure 3:
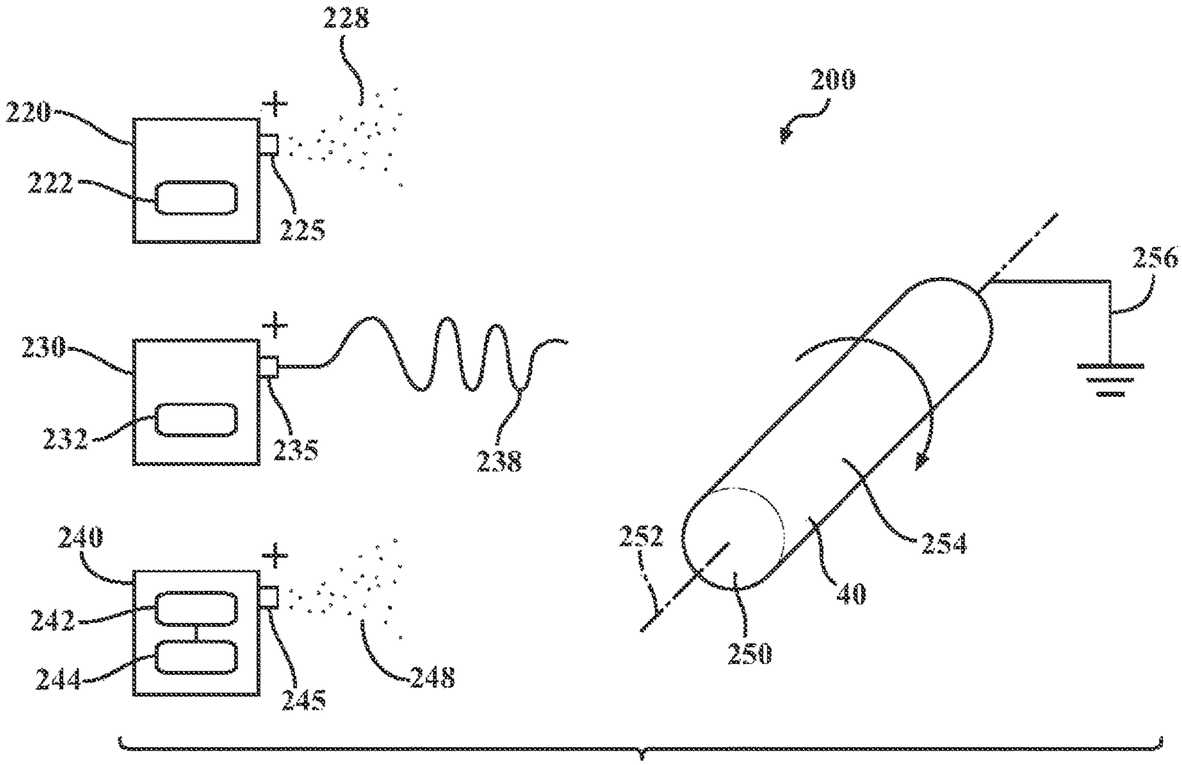
FIG. 3 schematically illustrates an operation to create the functional layer of FIG. 1 upon a polymer substrate, in accordance with the present disclosure.

FIG. 3 schematically illustrates an operation 200 to create the functional layer 62 of FIG. 1 upon a polymer substrate 40. The polymer substrate 40 is mounted to a surface 254 of a grounded spindle device 250 configured to spin about a longitudinal axis 252. Ground 256 is electrically connected to the grounded spindle device 250, such that an electric field may be utilized to cause a charged spray or material flow to be attracted to the grounded spindle device 250.

A plurality of piezoelectric material application devices 220, 230, 240 are illustrated. Each of the piezoelectric material application devices 220, 230, 240 are configured for moving to or being disposed to the grounded spindle device 250 and apply piezoelectric material to the polymer substrate 40. The grounded spindle device 250 may spin the polymer substrate 40 such that an even coating may be applied to the substrate 40. Each of the piezoelectric material application devices 220, 230, 240 include a respective positively charged nozzle 225, 235, 245. Each of the positively charged nozzles 225, 235, 245 are configured for imparting an electric charge upon particles emitted therefrom. The piezoelectric material application device 220 is configured for electrospraying, wherein a flow 228 of atomized or particulate material is emitted. The piezoelectric material application device 220 includes a storage tank 222 including a first piezoelectric material. In the embodiment of FIG. 3, the storage tank 222 may include PVDF particles in solution.

The piezoelectric material application device 230 is configured for electrospinning, wherein a flow 238 of nanoparticles is emitted. The piezoelectric material application device 230 includes a storage tank 232 including a second piezoelectric material. In the embodiment of FIG. 3, the storage tank 232 may include single crystal-type material nanoparticles in solution.

The piezoelectric material application device 240 is configured for applying a mixture of piezoelectric materials, wherein a flow 248 of the mixture is emitted. The piezoelectric material application device 240 includes a first storage tank 242 including a first piezoelectric material and a second storage tank 244 including a second piezoelectric material. The piezoelectric material application device 240 may modulate a mixture composition between the first piezoelectric material and the second piezoelectric material. An electric charge may be applied to each of the flows 228, 238, 248 such that the charged piezoelectric material is compelled to form a layer upon the substrate 40.

Figure 4:
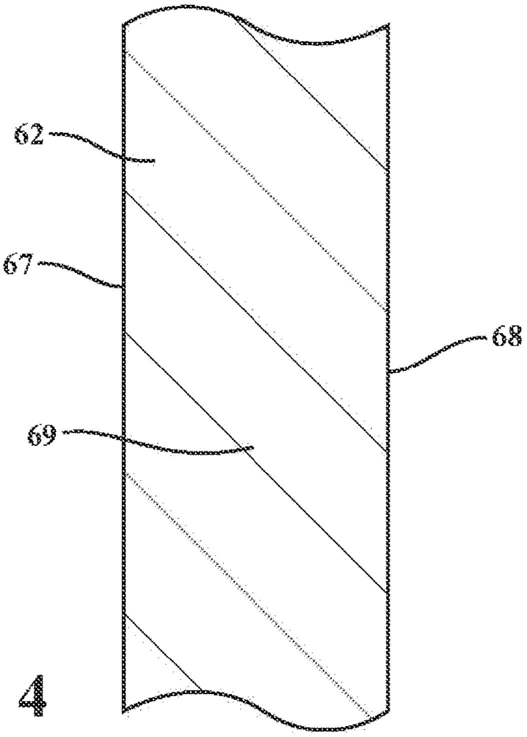
FIG. 4 schematically illustrates the second functional layer of FIG. 1 in magnified scale, in accordance with the present disclosure.

FIG. 4 schematically illustrates the second functional layer 62 of FIG. 1 in magnified scale. The first functional layer 61 of FIG. 1 may be identical to the second functional layer 62. The second functional layer 62 may include a first primary surface 67, a second primary surface 68, and a center 69. Concentration of the single crystal-type piezoelectric material may vary across the second functional layer 62. In a first concentration scheme, a maximum concentration, for example, 25 parts by weight of 100 parts total weight of the functional layer, may be present at each of the first primary surface 67 and the second primary surface 68, and the concentration may reduce linearly from both primary surfaces 67, 68 toward a 0% concentration at the center 69. In a second concentration scheme, a maximum concentration, for example, 15 parts by weight of 100 parts total weight of the functional layer, may be present at each of the first primary surface 67 and the second primary surface 68, and the concentration may reduce linearly from both primary surfaces 67, 68 toward a reduced concentration, for example, 10 parts by weight of 100 parts total weight of the functional layer, at the center 69. In a third concentration scheme, a maximum concentration, for example, 20 parts by weight of 100 parts total weight of the functional layer, may be present at each of the first primary surface 67 and the second primary surface 68, and the concentration may persist at the maximum concentration for some distance from both primary surfaces 67, 68. At some distance away from the primary surfaces 67, 68, the concentration may drop in a step fashion to a reduced value, for example, a 0% concentration. The concentration schemes provided are exemplary, and the disclosure is not intended to be limited to the examples herewithin.

Figure 5:
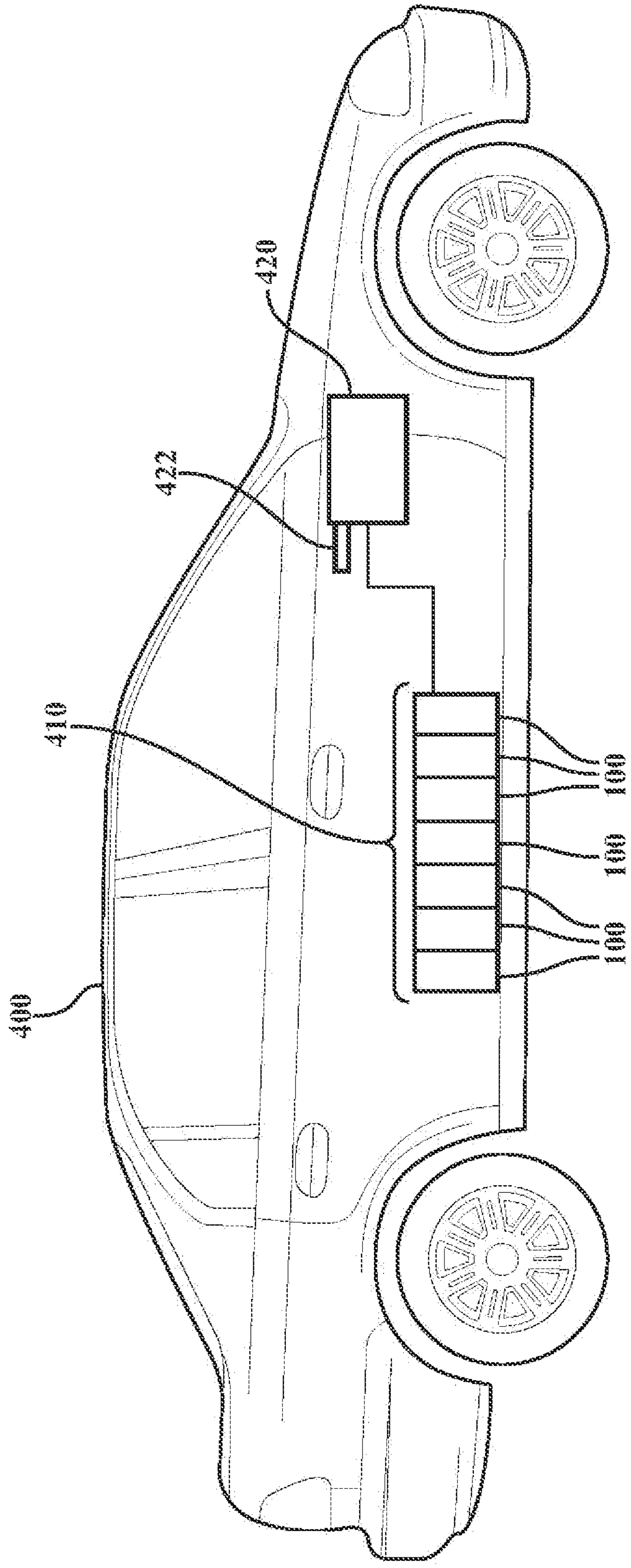
FIG. 5 schematically illustrates an exemplary device, e.g., a battery electric vehicle (BEV), including a battery pack that includes a plurality of battery cells, in accordance with the present disclosure.

The battery cell 100 may be utilized in a wide range of applications and powertrains. FIG. 5 schematically illustrates an exemplary device 400, e.g., a battery electric vehicle (BEV), including a battery pack 410 that includes a plurality of battery cells 100. The plurality of battery cells 100 may be connected in various combinations, for example, with a portion being connected in parallel and a portion being connected in series, to achieve goals of supplying electrical energy at a desired voltage. The battery pack 410 is illustrated as electrically connected to a motor generator unit 420 useful to provide motive force to the device 400. The motor generator unit 420 may include an output component 422, for example, an output shaft, which is provided mechanical energy useful to provide the motive force to the device 400. A number of variations to device 400 are envisioned, for example, including a powertrain, a boat, or an airplane, and the disclosure is not intended to be limited to the examples provided.

Figure 6:
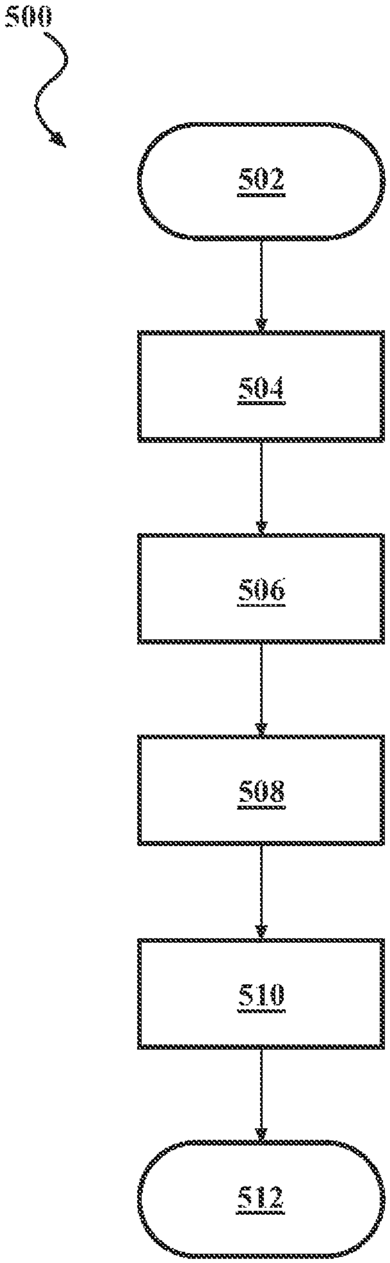
FIG. 6 is a flowchart illustrating a method for manufacturing the functional separator of FIG. 1 including the second functional layer, in accordance with the present disclosure.

FIG. 6 is a flowchart illustrating a method 500 for manufacturing the functional separator 10 of FIG. 1 including the second functional layer 62. The method 500 starts at step 502. At step 504, a polymer substrate 40 is disposed upon a grounded device in preparation for receiving a coating. At step 506, a first charged spray applying a first piezoelectric material is directed toward the polymer substrate 40. At step 508, a second charged spray applying a second piezoelectric material is directed toward the polymer substrate 40. At step 510, the functional separator is permitted to dry prior to being installed within a battery cell 100. At step 512, the method 500 ends. The method 500 is an exemplary method or process to manufacture the disclosed functional separator 10. A number of additional and/or alternative method steps are envisioned, and the disclosure is not intended to be limited to the examples provided herein.

Figure 7:
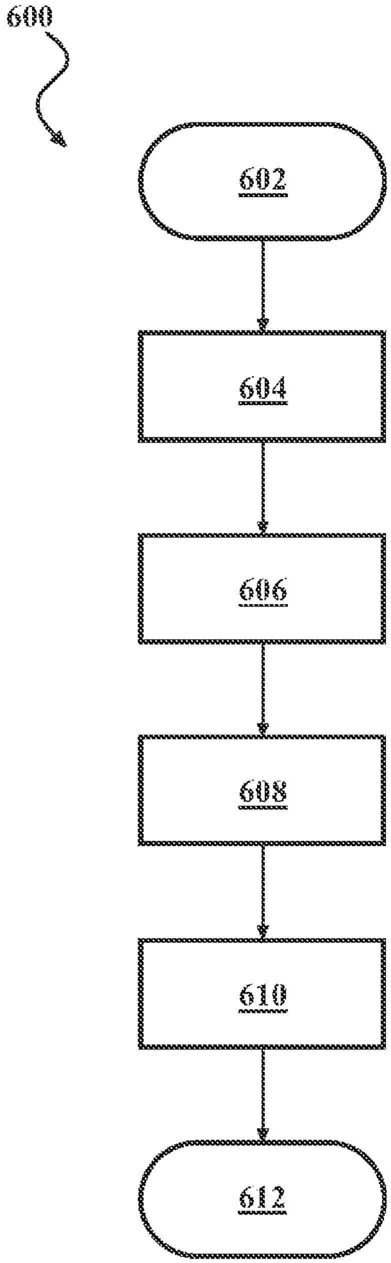
FIG. 7 is a flowchart illustrating a method for manufacturing the functional separator of FIG. 1 including the first functional layer and a second functional layer, in accordance with the present disclosure.

FIG. 7 is a flowchart illustrating a method 600 for manufacturing the functional separator 10 of FIG. 1 including the first functional layer 61 and the second functional layer 62. The method 600 starts at step 602. At step 604, a polymer substrate 40 is disposed upon a grounded device in preparation for receiving a coating. At step 606, a sequence of charged sprays applying alternating layers or a mixture of a first piezoelectric material and a second piezoelectric material are directed toward a first primary surface of the polymer substrate 40. At step 608, the polymer substrate 40 is flipped, and a sequence of charged sprays applying alternating layers or a mixture of the first piezoelectric material and the second piezoelectric material are directed toward a second primary surface of the polymer substrate 40. At step 610, the functional separator is permitted to dry prior to being installed within a battery cell 100. At step 612, the method 600 ends. The method 600 is an exemplary method or process to manufacture the disclosed functional separator 10. A number of additional and/or alternative method steps are envisioned, and the disclosure is not intended to be limited to the examples provided herein.

While the best modes for carrying out the disclosure have been described in detail, those familiar with the art to which this disclosure relates will recognize various alternative designs and embodiments for practicing the disclosure within the scope of the appended claims.

What is claimed is:

1. A self-protecting functional separator for a battery cell, the self-protecting functional separator comprising:
- a polymer substrate including:
  - a first primary surface; and
  - a second primary surface;
- a first functional layer applied to the first primary surface, wherein the first functional layer is a composite piezoelectric layer including:
  - a first piezoelectric material including nanoparticles of a single crystal-type piezoelectric material; and
  - a second piezoelectric material mixed with the nanoparticles of the single crystal-type piezoelectric material to form the composite piezoelectric layer; and
- a second functional layer, including a mixture of the first piezoelectric material and the second piezoelectric material, applied to the second primary surface,
  - wherein a concentration of the nanoparticles of the single crystal-type piezoelectric material within the self-protecting functional separator varies according to a gradient, with the concentration of the nanoparticles gradually increasing from a minimum concentration of the nanoparticles at each center of the first and second functional layers to a maximum concentration of the nanoparticles at the first primary surface and the second primary surface,
  - wherein the concentration of the nanoparticles of the single crystal-type piezoelectric material is linearly reduced from the maximum concentration at the second primary surface to a 0% concentration of the nanoparticles at a center of the second functional layer.

2. The self-protecting functional separator of claim 1, wherein the nanoparticles of the single crystal-type piezoelectric material include yttria-stabilized zirconia (YSZ) or gallium nitride (GaN).

3. The self-protecting functional separator of claim 2, wherein the second piezoelectric material includes polyvinylidene fluoride (PVDF) or poly (vinylidene difluoride-trifluoro ethylene) (P(VDF-TrFE)).

4. The self-protecting functional separator of claim 3, wherein the nanoparticles of the single crystal-type piezoelectric material are present within the first functional layer in a range from 1 part per 100 parts by total weight of the first functional layer to 25 parts per 100 parts by total weight of the first functional layer, and wherein the second piezoelectric material is present within the first functional layer in a range from 75 parts per 100 parts by total weight of the first functional layer to 99 parts per 100 parts by total weight of the first functional layer.

5. The self-protecting functional separator of claim 4, wherein the maximum concentration of the nanoparticles of the single crystal-type piezoelectric material at the first primary surface is in a range from 15 parts per 100 parts by total weight of the first functional layer to 25 parts per 100 parts by total weight of the first functional layer.

6. The self-protecting functional separator of claim 3, wherein the first functional layer includes a porosity density of at least 30%, wherein a thickness of the first functional layer ranges from 500 nanometers to 20 micrometers.

7. The self-protecting functional separator of claim 1, wherein a thickness of the self-protecting functional separator is in a range from 5 micrometers to 100 micrometers, wherein the battery cell comprises a lithium metal battery cell, and wherein the self-protecting functional separator is configured to increase interface contact area within the lithium metal battery cell to avoid high interfacial impedance caused by localized plating and striping in the lithium metal battery cell.

8. The self-protecting functional separator of claim 1, wherein the self-protecting functional separator is configured as a passive mechanism, wherein the first functional layer is configured to expand within an operating voltage window of the battery cell ranging from 0.5 Volts to 5 Volts, wherein expansion of the first functional layer increases a contact area between the self-protecting functional separator and electrodes of the battery cell, wherein a short circuit in the battery cell causes a voltage potential of the battery cell to drop, wherein the first functional layer is configured to contract when the voltage potential drops, and wherein the self-protecting functional separator is configured to shrink and break the short circuit when the first functional layer contracts.

9. The self-protecting functional separator of claim 1, further comprising a plurality of electrodes disposed to provide an input voltage to the self-protecting functional separator when a voltage potential drop in the battery cell is detected, wherein the electrodes comprise thin conductive layers having a thickness between 20 nanometers and 100 nanometers, and wherein the self-protecting functional separator is configured as an active mechanism, with the input voltage selectively causing the first functional layer to contract in response to the voltage potential drop in the battery cell.

10. A battery cell including a self-protecting functional separator, the battery cell comprising:

an anode;

a cathode;

an electrolyte; and the self-protecting functional separator comprising:

a polymer substrate including:

a first primary surface; and a second primary surface; and a first functional layer applied to the first primary surface, wherein the first functional layer is a composite piezoelectric layer including:

a first piezoelectric material including nanoparticles of a single crystal-type piezoelectric material; and a second piezoelectric material mixed with the nanoparticles of the single crystal-type piezoelectric material to form the composite piezoelectric layer;

a second functional layer, including a mixture of the first piezoelectric material and the second piezoelectric material, applied to the second primary surface, wherein a concentration of the nanoparticles of the single crystal-type piezoelectric material within the self-protecting functional separator varies according to a gradient, with the concentration of the nanoparticles gradually increasing from a minimum concentration of the nanoparticles at each center of the first and second functional layers to a maximum concentration of the nanoparticles at the first primary surface and the second primary surface, wherein the concentration of the nanoparticles of the single crystal-type piezoelectric material is linearly reduced from the maximum concentration at the second primary surface to a 0% concentration of the nanoparticles at a center of the second functional layer.

11. The battery cell of claim 10, wherein the maximum concentration of the nanoparticles at the second primary surface is in a range from 15 parts per 100 parts by total weight of the second functional layer to 25 parts per 100 parts by total weight of the second functional layer.

12. The battery cell of claim 10, wherein the nanoparticles of the single crystal-type piezoelectric material include lithium niobate ($LiNbO_3$), lithium tantalate ($LiTaO_3$), $Pb(Zr_{0.52}Ti_{0.48})O_3$ (PZT), yttria-stabilized zirconia (YSZ), aluminum nitride (AlN), zinc oxide (ZnO), or gallium nitride (GaN).

13. The battery cell of claim 10, wherein the first piezoelectric material includes yttria-stabilized zirconia (YSZ) or gallium nitride (GaN), and wherein the second piezoelectric material includes polyvinylidene fluoride (PVDF) or poly (vinylidene difluoride-trifluoro ethylene) (P(VDF-TrFE)).

14. The battery cell of claim 13, wherein the first functional layer and the second functional layer are configured to contract when a voltage potential of the battery cell drops due to a short circuit in the battery cell, wherein the short circuit is created by a dendrite formed upon at least one of the anode or the cathode, and wherein contraction of the first functional layer and the second functional layer causes the self-protecting functional separator to retract and self-protect itself from the dendrite.

15. The battery cell of claim 10, wherein the electrolyte includes one of a solid-state electrolyte including the first piezoelectric material, a gel electrolyte including the first piezoelectric material, a liquid electrolyte, or a quasi-solid electrolyte including the first piezoelectric material.

16. The battery cell of claim 15, wherein the electrolyte includes the liquid electrolyte, wherein the anode is in direct contact with the first functional layer, wherein the cathode is in direct contact with the second functional layer, and wherein the battery cell is configured to:

control a voltage potential between the anode and the cathode such that the self-protecting functional separator physically changes dimensions responsive to an internal short circuit of the battery cell; and utilize an electric field generated by the voltage potential between the anode and the cathode to actively control physical contraction of the first functional layer and the second functional layer.

17. The battery cell of claim 15, wherein the electrolyte includes the solid-state electrolyte or the gel electrolyte, and wherein solid electrolyte materials are mixed with the first piezoelectric material in the solid-state electrolyte or the gel electrolyte.

18. The battery cell of claim 17, wherein the electrolyte includes the solid-state electrolyte, wherein the battery cell includes electrodes configured to provide an input voltage to the self-protecting functional separator when a cell voltage drop indicative of a short circuit is detected, wherein the short circuit is created by a dendrite formed upon at least one of the anode or the cathode, wherein the first functional layer and the second functional layer are configured to contract in response to the cell voltage drop in the battery cell, and wherein the self-protecting functional separator is configured to retract and self-protect itself from the dendrite when the first functional layer and the second functional layer contract.

* * * * *